(12) United States Patent
Ryu

(10) Patent No.: US 12,207,501 B2
(45) Date of Patent: Jan. 21, 2025

(54) TRANSPARENT DISPLAY PANEL

(71) Applicant: LG DISPLAY CO., LTD., Seoul (KR)

(72) Inventor: Hojin Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 490 days.

(21) Appl. No.: 17/555,791

(22) Filed: Dec. 20, 2021

(65) Prior Publication Data

US 2022/0208907 A1    Jun. 30, 2022

(30) Foreign Application Priority Data

Dec. 31, 2020 (KR) .................. 10-2020-0189447

(51) Int. Cl.
    *H10K 59/122*      (2023.01)
    *H10K 50/814*      (2023.01)
    *H10K 59/131*      (2023.01)
    *H10K 59/35*      (2023.01)

(52) U.S. Cl.
    CPC ......... *H10K 59/122* (2023.02); *H10K 50/814* (2023.02); *H10K 59/131* (2023.02); *H10K 59/353* (2023.02)

(58) Field of Classification Search
    CPC ........................................... H10K 59/10–221
    See application file for complete search history.

(56) References Cited

U.S. PATENT DOCUMENTS

| 2015/0097171 A1* | 4/2015 | Kim ................. H10K 59/80524 |
| | | 438/23 |
| 2015/0187859 A1* | 7/2015 | Choi .................... G09G 3/3225 |
| | | 257/72 |
| 2018/0166649 A1* | 6/2018 | Woo ..................... H10K 59/122 |

FOREIGN PATENT DOCUMENTS

KR      2020-0066959 A      6/2020

* cited by examiner

*Primary Examiner* — Evren Seven
*Assistant Examiner* — Cole Leon Lindsey
(74) *Attorney, Agent, or Firm* — POLSINELLI PC

(57) ABSTRACT

A transparent display panel includes a substrate where main light-emitting areas, auxiliary light-emitting areas, and transmissive areas are defined, a driving transistor disposed on the substrate, anode electrodes disposed on the main light-emitting areas, auxiliary anode electrodes disposed on the auxiliary light-emitting areas, auxiliary electrodes disposed on the transmissive areas and connected to a low-potential driving power source, and a bank disposed to expose a center portion of the anode electrodes, the auxiliary anode electrodes, and the auxiliary electrodes, and disposed to cover an edge area of the anode electrodes, the auxiliary anode electrodes, and the auxiliary electrodes, thereby defining the main light-emitting areas, the auxiliary light-emitting areas, and the transmissive areas.

20 Claims, 10 Drawing Sheets

TRANSPARENT DISPLAY PANEL

CROSS-REFERENCE TO RELATED APPLICATION

The present application claims the priority of Korean Patent Application No. 10-2020-0189447, filed on Dec. 31, 2020, which is hereby incorporated by reference in its entirety for all purposes.

BACKGROUND

Field of the Disclosure

The present disclosure relates to a display device, and more particularly, to a transparent display device. Although the present disclosure is suitable for a wide scope of applications, it is particularly suitable for improving a surface flatness of a light-emitting layer of the transparent display device formed by a solution process.

Description of the Background

An organic light-emitting element (hereinafter, "a light-emitting element") constituting an organic light-emitting display device is self-luminous and does not require a separate light source, so that a thickness and a weight of a display device can be reduced. In addition, the organic light-emitting display device has desirable characteristics, such as low power consumption, high luminance, and a fast response rate.

In general, a light-emitting element has a structure having a plurality of stacked layers such as an anode electrode, a bank surrounding an edge area of the anode electrode, a light-emitting layer formed on the anode electrode at an inside of the bank, and a cathode electrode covering the light-emitting layer and the bank. The amount of current flowing to the light-emitting element is controlled by a driving transistor, so that the light-emitting element emits light at a required luminance.

The organic light-emitting display device may be configured as a transparent display device by making a transistor or a light-emitting element inside the organic light-emitting display device to be in transparent form, or by separating a circuit area and a transmissive area from each other.

SUMMARY

The present disclosure is to provide a display panel that improves a surface flatness of a light-emitting layer that is formed by performing a solution process.

In addition, the present disclosure is to provide a display panel having a portion of a transmissive portion thereof configured as an auxiliary light-emitting portion, thereby enabling a defective pixel to be repaired.

According to an aspect, the transparent display panel may include: a substrate where main light-emitting areas, auxiliary light-emitting areas, and transmissive areas are defined; a driving transistor disposed on the substrate; main anode electrodes disposed on the main light-emitting areas; auxiliary anode electrodes disposed on the auxiliary light-emitting areas; auxiliary electrodes disposed on the transmissive areas and connected to a low-potential driving power source; and a bank disposed to expose center portions of the main anode electrodes, the auxiliary anode electrodes, and the auxiliary electrodes, and disposed to cover edge areas of the main anode electrodes, the auxiliary anode electrodes, and the auxiliary electrodes, thereby defining the main light-emitting areas, the auxiliary light-emitting areas, and the transmissive areas.

Each of the auxiliary anode electrodes and the auxiliary electrodes may be formed of a transparent conductive material.

In the transparent display panel, the main light-emitting areas having the same color may be disposed in a row direction, and the main light-emitting areas having different color may be disposed in a column direction that is perpendicular to the row direction.

The auxiliary light-emitting areas may be disposed between the main light-emitting areas having the same color adjacent to each other in the row direction, and the transmissive areas may be disposed between the auxiliary light-emitting areas adjacent to each other in the column direction.

The bank may include: a hydrophilic bank surrounding the main light-emitting areas, the auxiliary light-emitting areas, and the transmissive areas; and a hydrophobic bank formed on one area of the hydrophilic bank and dividing pixel rows by extending in the row direction, and disposed to surround the transmissive areas such that the transmissive areas are divided from the adjacent main light-emitting areas and the adjacent auxiliary light-emitting areas.

The transparent display panel may further include a light-emitting layer formed on each of the exposed center areas of both the main anode electrodes and the auxiliary anode electrodes, wherein a surface of an edge area of the light-emitting layer adjacent to the bank may be configured to be higher than a surface of a center area of the light-emitting layer.

The transparent display panel may further include a cathode electrode formed widely on the substrate and formed of a transparent conductive material, wherein, in the transmissive area, the cathode electrode may be in direct contact with the exposed center areas of the auxiliary electrodes.

The transparent display panel may further include high-potential auxiliary wirings and low-potential auxiliary wirings that extend in the column direction on the substrate and disposed alternately between the main light-emitting areas and the auxiliary light-emitting areas.

At least one area of each of the auxiliary electrodes may be disposed to overlap a corresponding low-potential auxiliary wiring, and the auxiliary electrode may be connected to the low-potential auxiliary wiring by a via hole.

The via hole may be covered by the hydrophobic bank that surrounds the transmissive areas.

The driving transistor disposed on the substrate may be configured to apply a driving current to the main anode electrodes or the auxiliary anode electrodes.

The driving transistor may include a source electrode connected to a corresponding main anode electrode or a corresponding auxiliary anode electrode; a drain electrode connected to a high-potential auxiliary wiring; and a gate electrode configured to receive a data signal.

With respect to at least a portion of the driving transistor, a space between the source electrode and the corresponding main anode electrode may be cut by laser, and the space between the source electrode and the corresponding main anode electrode may be welded by laser.

According to aspects, the transparent display panel enables reduction of a Mura defect by improving surface flatness of the light-emitting layer, and enables the cathode electrode of the main light-emitting element to be directly in contact with the auxiliary electrode.

According to aspects, the transparent display panel enables the repairing of the defective pixel while improving transparency of the display panel by using the auxiliary light-emitting portion that is configured as the transparent portion.

BRIEF DESCRIPTION OF THE DRAWINGS

The above and other features and advantages of the present disclosure will be more clearly understood from the following detailed description when taken in conjunction with the accompanying drawings, in which.

DETAILED DESCRIPTION

Figure 1:
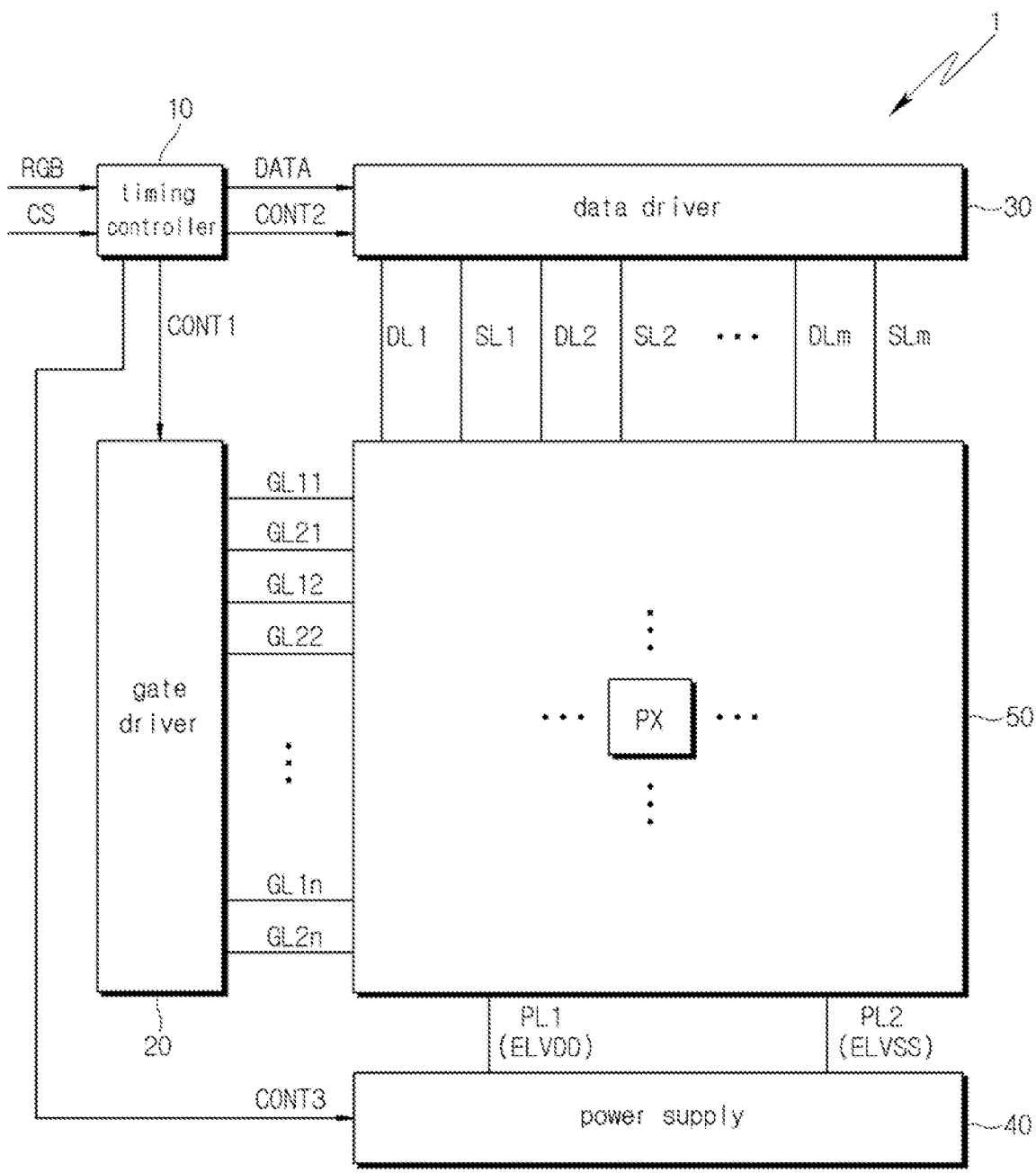
FIG. 1 is a block diagram illustrating a configuration of a display device according to an aspect of the present disclosure.

Hereinafter, aspects of the present disclosure will be described in detail with reference to the accompanying drawings. In this specification, it will be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawings, the thickness, ratio, and dimensions of components are exaggerated for clarity of illustration. The term "and/or" includes one or more combinations that the associated elements may define.

It will be understood that although the terms such as "first" and "second" are used herein to describe various elements, these elements should not be limited by these terms. The terms are only used to distinguish one component from other components. For example, a first element referred to as a first element in one aspect can be referred to as a second element in another aspect without departing from the scope of the appended claims. The terms of a singular form may include plural forms unless referred to the contrary.

Also, ""under", "below", "above", "upper", and the like are used for explaining relation association of components illustrated in the drawings. These terms are relative concepts and are described on the basis of the direction in the drawings.

The meaning of the term "include" or "comprise" specifies a property, a fixed number, a step, an operation, an element, a component or a combination thereof, but does not exclude other properties, fixed numbers, steps, operations, elements, components or combinations thereof.

FIG. 1 is a block diagram illustrating a configuration of a display device according to an aspect of the present disclosure.

Referring to FIG. 1, a display device 1 includes a timing controller 10, a gate driver 20, a data driver 30, a power supply 40 and a display panel 50.

The timing controller 10 may receive an image signal RGB and a control signal CS from outside the display device 1. The image signal RGB may include a plurality of gray scale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may generate gate signals on the basis of the gate driving control signal CONT1 output from the timing controller 10. The gate driver 20 may provide the generated gate signals to the pixels PX through multiple first gate lines GL11 to GL1n.

The gate driver 20 may provide a sensing signal to the pixels PX through multiple second gate lines GL21 to GL2n. The sensing signal may be supplied so as to measure a characteristic of a driving transistor and/or a light-emitting element provided inside the pixels PX.

The data driver 30 may generate data signals on the basis of the image data DATA and the data driving control signal CONT2 output from the timing controller 10. The data driver 30 may provide the generated data signals to the pixels PX through the multiple data lines DL1 to DLm.

The data driver 30 may provide a reference voltage (a sensing voltage, or an initialization voltage) to the pixels PX through the multiple sensing lines SL1 to SLm, or may sense states of the pixels PX on the basis of an electrical signal fed back from the pixels PX.

The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PX, through corresponding power lines PL1 and PL2.

In the display panel 50, the multiple pixels PX (or referred to as sub-pixels) are disposed. The pixels PX may be, for example, arranged in a matrix form on the display panel 50. The pixels PX may emit light with luminance corresponding to the gate signals and the data signals that are supplied through the first gate lines GL11 to GL1n and the data lines DL1 to DLm, respectively. In an aspect, each pixel PX may display any one among red, green, blue, and white colors, but is not limited thereto.

The timing controller 10, the gate driver 20, the data driver 30, and the power supply 40 may be configured as separate integrated circuits (ICs), or ICs in which at least some thereof are integrated. For example, at least one among the data driver 30 and the power supply 40 may be configured as an integrated circuit integrated with the timing controller 10.

In addition, in FIG. 1, the gate driver 20 and the data driver 30 are illustrated as elements separated from the display panel 50, but at least one among the gate driver 20 and the data driver 30 may be configured in an in-panel manner that is formed integrally with the display panel 50.

For example, the gate driver 20 may be formed integrally with the display panel 50 according to a gate-in-panel (GIP) manner.

Figure 2:
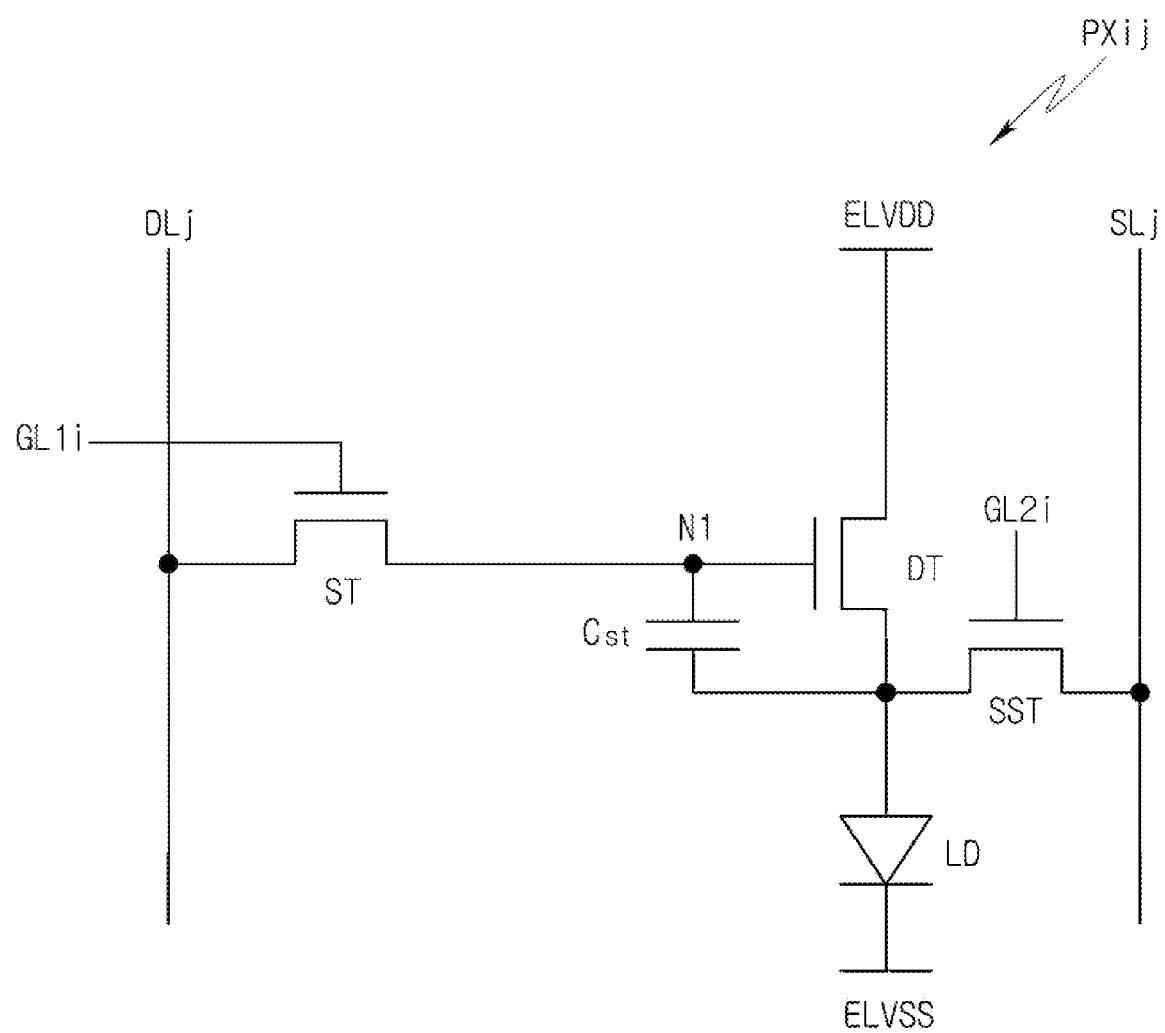
FIG. 2 is a circuit diagram illustrating an aspect of a pixel illustrated in FIG. 1.

FIG. 2 is a circuit diagram illustrating an aspect of a pixel illustrated in FIG. 1. FIG. 2 illustrates, as an example, a pixel PXij that is connected to an i-th first gate line GL1i and a j-th data line DLj.

Referring to FIG. 2, the pixel PX includes a switching transistor ST, a driving transistor DT, a sensing transistor SST, a storage capacitor Cst, and a main light-emitting element LD.

A first electrode of the switching transistor ST is connected to the j-th data line DLj and a second electrode of the switching transistor ST is connected to a first node N1. A gate electrode of the switching transistor ST is connected to the i-th first gate line GL1i. The switching transistor ST is turned on when a gate signal at a gate-on level is applied through the i-th first gate line GL1i, and transmits a data signal applied through the j-th data line DLj, to the first node N1.

A first electrode of the storage capacitor Cst is connected to the first node N1, and a second electrode of the storage capacitor Cst may be configured to receive the high-potential driving voltage ELVDD. The storage capacitor Cst may charge a voltage corresponding to a difference between a voltage applied to the first node N1 and the high-potential driving voltage ELVDD.

A first electrode of the driving transistor DT is configured to receive the high-potential driving voltage ELVDD, and a second electrode of the driving transistor DT is connected to a first electrode (for example, an anode electrode) of the main light-emitting element LD. A gate electrode of the driving transistor DT is connected to the first node N1. The driving transistor DT is turned on when a voltage at a gate-on level is applied through the first node N1, and may control the amount of a driving current flowing to the main light-emitting element LD depending on a voltage provided to the gate electrode, that is, a voltage stored in the storage capacitor Cst.

A first electrode of the sensing transistor SST is connected to a j-th sensing line SLj, and a second electrode of the sensing transistor SST is connected to the first electrode of the main light-emitting element LD. A gate electrode of the sensing transistor SST is connected to an i-th second gate line GL2i. The sensing transistor SST is turned on when a sensing signal at a gate-on level is applied through the i-th second gate line GL2i, and transmits a reference voltage applied through the j-th sensing line SLj, to the first electrode of the main light-emitting element LD.

The main light-emitting element LD outputs light corresponding to the driving current. The main light-emitting element LD may be an organic light-emitting diode (OLED) or an ultra-small inorganic light-emitting diode having a size in a micro to nanoscale range, but the present disclosure is not limited thereto. Hereinafter, aspects in which the main light-emitting element LD is constructed as an organic light-emitting diode will be described.

In the present disclosure, the structure of the pixels PX is not limited to that shown in FIG. 2. According to an aspect, the pixels PX may further include at least one element for compensating for a threshold voltage of the driving transistor DT, or initializing a voltage of the gate electrode of the driving transistor DT and/or a voltage of the anode electrode of the main light-emitting element LD.

FIG. 2 illustrates an example in which the switching transistor ST, the driving transistor DT, and the sensing transistor SST are NMOS transistors, but the present disclosure is not limited thereto. For example, at least some or all of the transistors constituting each pixel PX may be constructed as PMOS transistors. In various aspects, each of the switching transistor ST, the driving transistor DT, and the sensing transistor SST may be implemented as a low-temperature polycrystalline silicon (LTPS) thin-film transistor, an oxide thin-film transistor, or a low-temperature polycrystalline oxide (LTPO) thin-film transistor.

Figure 3:
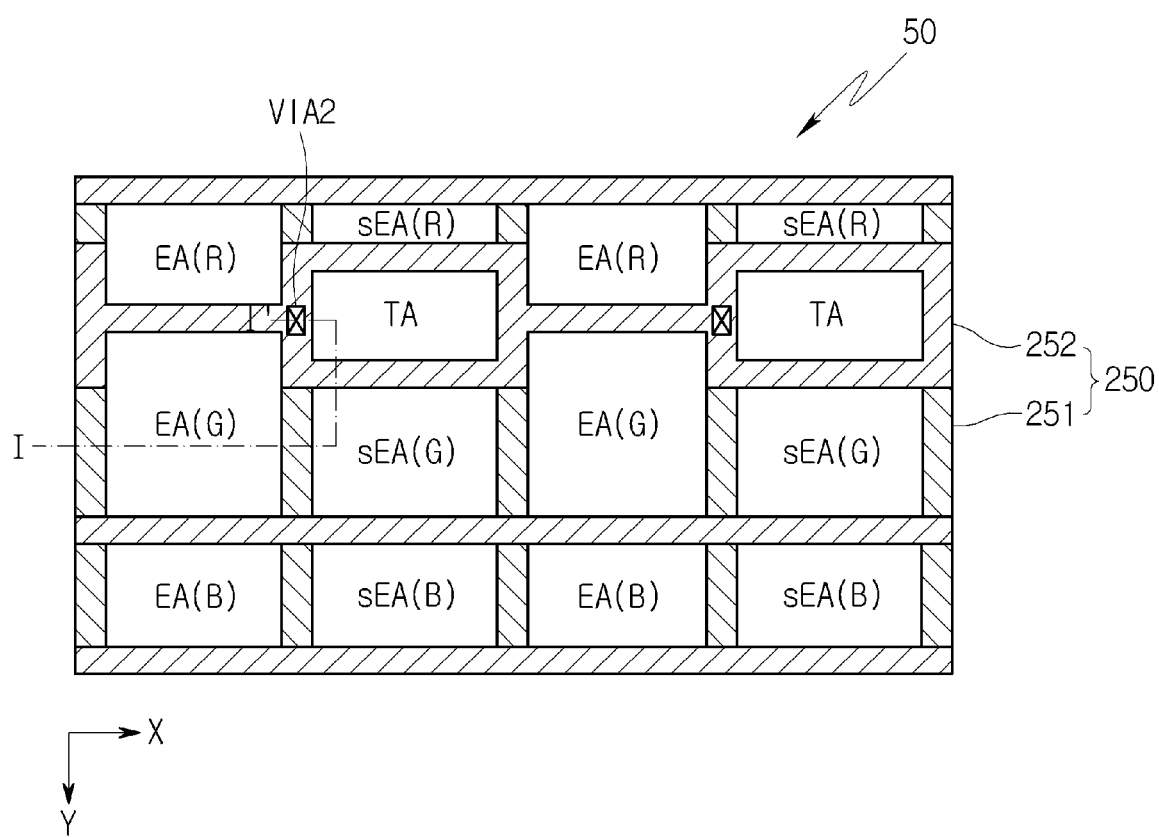
FIGS. 3 and 4 are plan views illustrating a display panel according to an aspect of the present disclosure.
Figure 4:
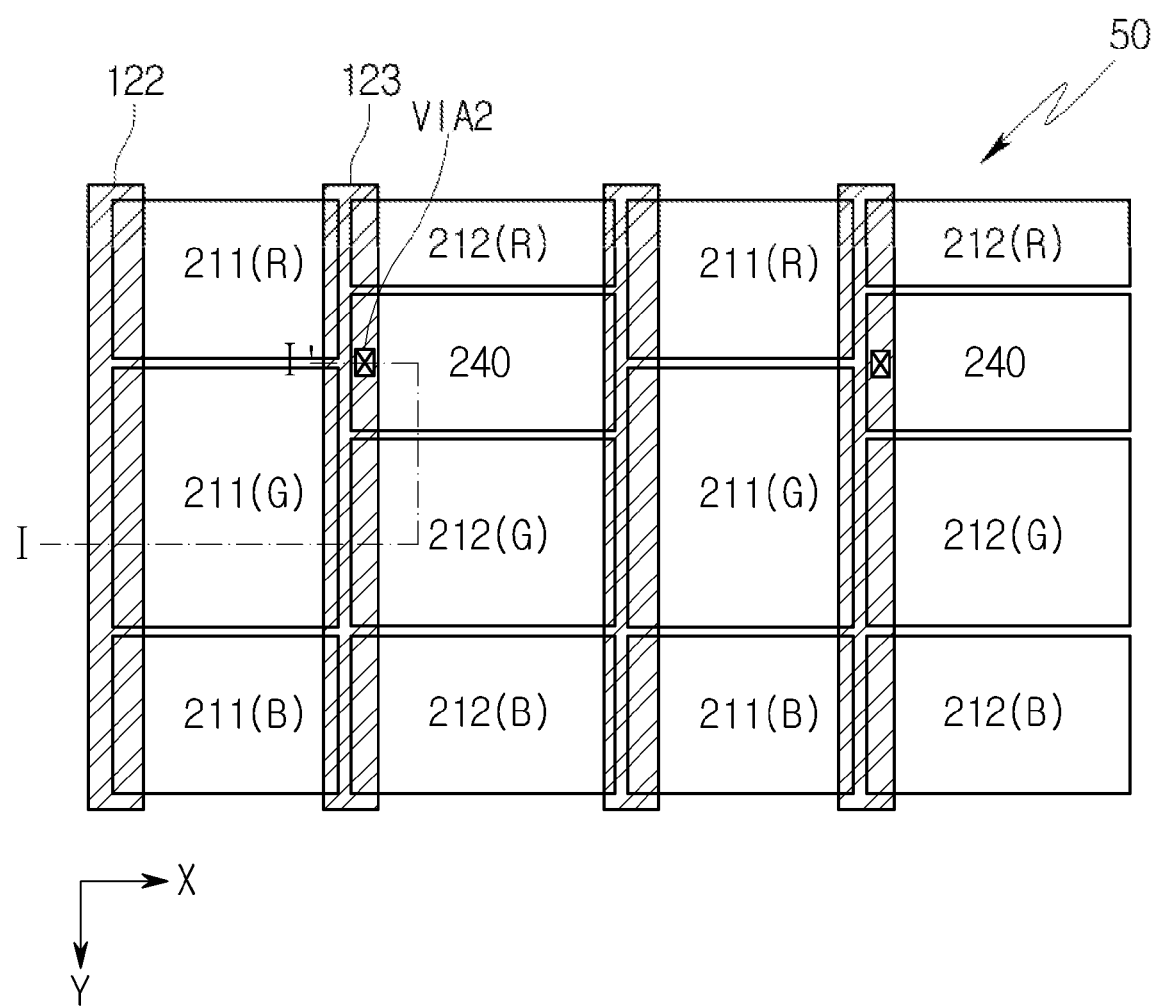

FIGS. 3 and 4 are plan views illustrating a display panel according to an aspect of the present disclosure. Specifically, in FIG. 3, main light-emitting areas EA of pixels R, G, and B that are disposed on the display panel 50, auxiliary light-emitting areas sEA, and transmissive areas TA that are disposed adjacent to the pixels R, G, and B are illustrated. In addition, in FIG. 4, main anode electrodes 211, auxiliary anode electrodes 212, and auxiliary electrodes 240 of the pixels R, G, and B that are disposed on the display panel 50 are illustrated.

According to the aspect of the present disclosure, multiple pixels R, G, and B are disposed on the display panel 50. Each pixel R, G, and B may display one of red, green, and blue colors.

The pixels R, G, and B may be arranged along a row direction X and a column direction Y that are intersecting each other. The pixels R, G, and B arranged adjacently along the row direction X may display the same color, and the pixels R, G, and B arranged adjacently along the column direction Y may display different colors.

The display panel 50 may include the main light-emitting areas EA, the auxiliary light-emitting areas sEA, and the transmissive areas TA. The main light-emitting area EA refers to an area on which main light-emitting elements of each pixels R, G, and B are disposed and emitting light depending on the amount of current controlled by the driving transistor in FIG. 2. In this aspect, the size of the main light-emitting area EA of the pixels R, G, and B may be the same or different. In this aspect, the main light-emitting area EA of the green pixel G may have a larger area than the main light-emitting area EA of the red pixel R and the blue pixel B. However, the aspect is not limited thereto.

The auxiliary light-emitting area sEA is disposed between the main light-emitting areas EA of the same color adjacent in the row direction X. The auxiliary light-emitting area sEA is a part of the transmissive area TA, and may be an area on which an auxiliary light-emitting element is disposed. The auxiliary light-emitting element may be provided so as to emit light instead of the main light-emitting element in response to the control of the driving transistor DT when a failure occurs in any pixel R, G, and B. To this end, one main anode electrode 211 of the main light-emitting element and one auxiliary anode electrode 212 of the auxiliary light-emitting element may be disposed on the main light-emitting area EA and the auxiliary light-emitting area sEA, respectively.

The transmissive area TA is an area that does not have an opaque conductive layer and thus passes external light therethrough. The transmissive area TA is disposed between the auxiliary light-emitting areas sEA that are disposed in the column direction Y. For example, the transmissive area TA may be disposed between the auxiliary light-emitting area sEA of the red pixel R and the auxiliary light-emitting area sEA of the green pixel G. In this example, the auxiliary light-emitting area sEA of the red pixel R and the auxiliary light-emitting area sEA of the green pixel G that are adjacent to the transmissive area TA may have a smaller area than the auxiliary light-emitting area sEA of the blue pixel B that is not adjacent to the transmissive area TA.

Figure 5:
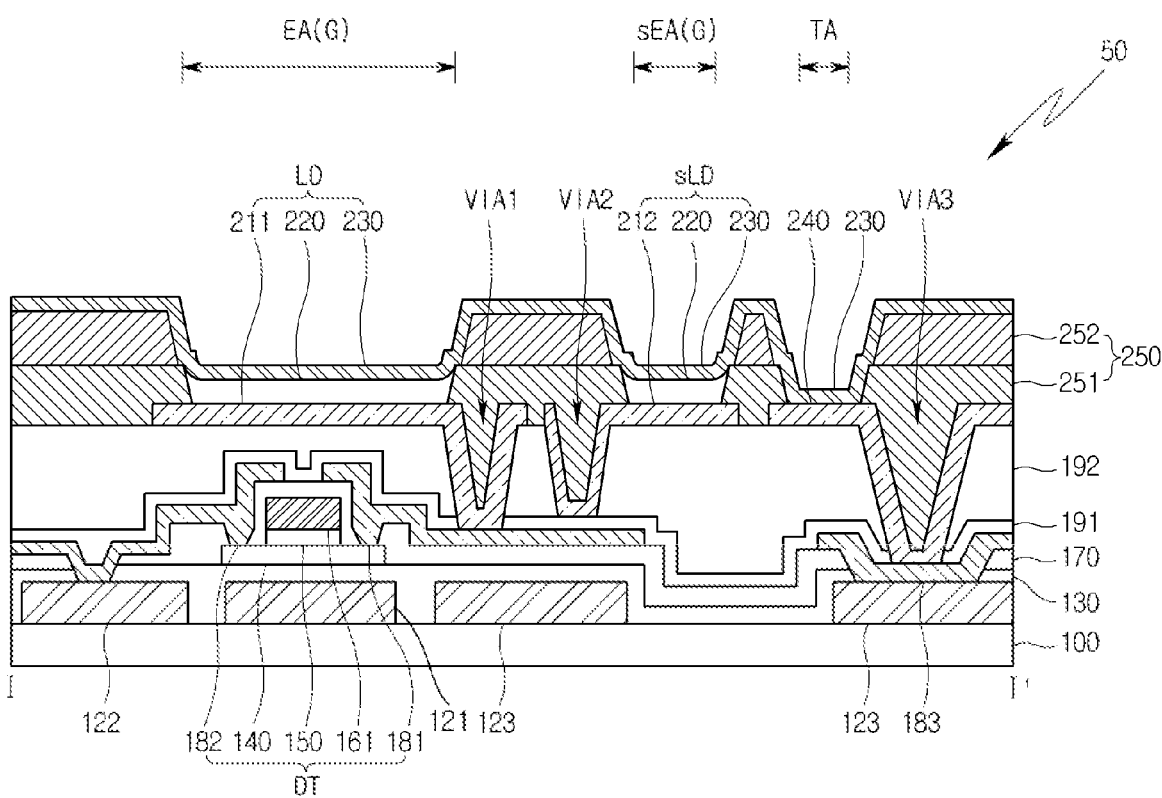
FIG. 5 is a cross-sectional view taken along line I-I' in FIGS. 3 and 4.

FIG. 5 is a cross-sectional view taken along line I-I' in FIGS. 3 and 4.

Referring to FIG. 5, the display panel 50 may include a substrate 100, a circuit element layer formed on the substrate 100 and provided with at least one circuit element, and a light-emitting element layer provided with the main light-emitting element LD.

The substrate 100 may include a light-transmitting substrate, as a base substrate of the display panel 50. More specifically, the substrate 100 may include a rigid substrate including glass or tempered glass, or a flexible substrate made of plastic.

The substrate 100 may include the main light-emitting area EA, the auxiliary light-emitting area sEA, and the transmissive area TA. The circuit element layer is formed on the substrate 100, and may include circuit elements (e.g., transistors and capacitors) and wirings constituting the pixels R, G, and B.

A first conductive layer may be disposed on the substrate 100. The first conductive layer may include a light blocking layer 121, a high-potential auxiliary wiring 122, and a low-potential auxiliary wiring 123. The light blocking layer 121 is disposed to overlap with an active layer 140, particularly, a channel on a plane, thereby protecting an oxide semiconductor element from the external light exposure.

The high-potential auxiliary wiring 122 may be connected to a first power line PL1 to which the high-potential driving voltage ELVDD is applied, and the low-potential auxiliary wiring 123 may be connected to a second power line PL2 to which the low-potential driving voltage ELVSS is applied. In an aspect in the present disclosure, the high-potential auxiliary wiring 122 and the low-potential auxiliary wiring 123 may be extended in the column direction Y between the main light-emitting areas EA and the transmissive areas TA. For example, the high-potential auxiliary wiring 122 may be disposed between the main light-emitting areas EA of one of pixels R, G, and B and the auxiliary light-emitting areas sEA of one of pixels R, G, and B that are adjacent thereto. Further, the low-potential auxiliary wiring 123 may be disposed between the main light-emitting areas EA of any of the pixels R, G, and B and the auxiliary light-emitting areas sEA of any of the pixels R, G, and B corresponding thereto. The main light-emitting areas EA for the pixels R, G, and B of different colors may be disposed between the high-potential auxiliary wiring 122 and the low-potential auxiliary wiring 123.

A buffer layer 130 is disposed on the substrate 100 to cover the first conductive layer. The buffer layer 130 may prevent ions or impurities from diffusing from the substrate 100 and block moisture penetration.

The active layer 140 may be formed on the buffer layer 130. The active layer 140 may be formed of a silicon-based semiconductor material or an oxide-based semiconductor material. The active layer 140 may include a source region and a drain region containing p-type or n-type impurities, and a channel formed between the source region and the drain region.

A gate insulating layer 150 may be disposed corresponding to a region where a gate electrode 161 that is to be described later is formed. For example, the gate insulating layer 150 may be formed on the channel of the active layer 140.

A second conductive layer may be disposed on the gate insulating layer 150. The second conductive layer may include the gate electrode 161. The gate electrode 161 may be disposed at a position corresponding to the channel of the active layer 140.

An interlayer insulating layer 170 may be formed on the second conductive layer. A third conductive layer may be formed on the interlayer insulating layer 170. The third conductive layer may include a source electrode 181 and a drain electrode 182. The source electrode 181 and the drain electrode 182 may be connected to the source region and the drain region of the active layer 140 through contact holes passing through the interlayer insulating layer 170, respectively. The source electrode 181 and the drain electrode 182 may be configured as a single layer or multiple layers.

The source electrode 181, the drain electrode 182, the gate electrode 161, and the active layer 140 corresponding thereto may constitute a transistor. In FIG. 5, a driving transistor in which the source electrode 181 is connected to the main anode electrode 211 of the main light emitting element LD is illustrated as an example.

The third conductive layer may further include a bridge electrode 183. The bridge electrode 183 is connected to the low-potential auxiliary wiring 123 through a contact hole passing through the interlayer insulating layer 170 and the buffer layer 130.

The circuit element layer may be covered by a passivation layer 191 and an overcoat layer 192. The passivation layer 191 may be as an insulating layer intended to protect the underlying elements. The overcoat layer 192 may be a flattening film intended to alleviate a step difference of the lower structure.

The light-emitting element layer is formed on the overcoat layer 192 and includes the main light-emitting elements LD and auxiliary light-emitting elements sLD. The main light-emitting element LD includes the main anode electrode 211, a light-emitting layer 220, and a cathode electrode 230. The auxiliary light-emitting element sLD includes an auxiliary anode electrode 212, the light-emitting layer 220, and the cathode electrode 230.

The main anode electrode 211 is formed on the overcoat layer 192 in the main light-emitting area EA. The main anode electrode 211 is connected to the driving transistor DT through a first via hole VIA1 passing through the overcoat layer 192 and the passivation layer 191. The main anode electrode 211 may be composed of a transparent conductive material such as indium tin oxide (ITO), indium zinc oxide (IZO) and zinc oxide (ZnO). When the main anode electrode 211 is a reflective electrode, the main anode electrode 211 may be configured as a triple layer composed of a transparent conductive layer/reflective layer (metal oxide layer)/transparent conductive layer. For example, the main anode electrode 211 may be composed of a triple layer including ITO/Ag/ITO.

In the aspect, the auxiliary anode electrode 212 is further formed on the overcoat layer 192. The auxiliary anode electrode 212 is formed in the auxiliary light-emitting area sEA.

The auxiliary anode electrode 212 may be disposed such that at least one region thereof overlaps the source electrode 181. In one area, the auxiliary anode electrode 212 may be configured such that only the passivation layer 191 having a relatively smaller thickness is interposed between the auxiliary anode electrode 212 and the source electrode 181. That is, the auxiliary anode electrode 212 may be in contact with the passivation layer 191 through a second via hole VIA2. Within the second via hole VIA2, the auxiliary anode electrode 212 and the source electrode 181 are disposed adjacent to each other. Therefore, during a pixel repair process, the passivation layer 191 positioned between the auxiliary anode electrode 212 and the source electrode 181 may be removed by laser light radiated from outside, so that the auxiliary anode electrode 212 and the source electrode 181 may be in contact with each other. The pixel repair process will be described in detail with reference to FIGS. 6 to 8.

The auxiliary anode electrode 212 may be formed of the same or different material as the main anode electrode 211. In an aspect, the auxiliary anode electrode 212 may be formed of a transparent material. For example, the auxiliary anode electrode 212 may be formed of a transparent conductive material such as indium tin oxide (ITO), indium zinc oxide (IZO) and zinc oxide (ZnO). Since the auxiliary anode electrode 212 is formed of the transparent conductive material, the auxiliary light-emitting area sEA may function as the transmissive area TA before the pixels are repaired.

On the overcoat layer 192, the auxiliary electrode 240 for connecting the cathode electrode 230 to the bridge electrode 183 is further formed. The auxiliary electrode 240 is formed in the transmissive area TA. The auxiliary electrode 240 may be connected to the bridge electrode 183 through a third via hole VIA3.

The auxiliary electrode 240 may be formed of the same or different material as the main anode electrode 211. However, since the auxiliary electrode 240 is disposed on the transmissive area TA, the auxiliary electrode 240 is formed of a transparent material. For example, the auxiliary electrode 240 may be formed of a transparent conductive material such as indium tin oxide (ITO), indium zinc oxide (IZO) and zinc oxide (ZnO).

In an aspect, the auxiliary electrode 240 may be disposed such that one of an edge thereof overlaps the low-potential auxiliary wiring 123. In the overlapped area, the auxiliary electrode 240 may be connected to the bridge electrode 183 via the third via hole VIA3, and may be connected to the low-potential auxiliary wiring 123 via the bridge electrode 183.

A bank 250 may be formed on the overcoat layer 192. In an aspect, the bank 250 may have a structure in which a hydrophilic bank 251 and a hydrophobic bank 252 are stacked.

The hydrophilic bank 251 may be formed to expose center areas of both the main anode electrodes 211 and the auxiliary anode electrodes 212 and to cover edge areas of both the main anode electrodes 211 and the auxiliary anode electrodes 212. The exposed areas of both the main anode electrodes 211 and the auxiliary anode electrodes 212 that are not covered by the hydrophilic bank 251 may be defined as the main light-emitting areas EA and the auxiliary light-emitting areas sEA of the pixels R, G, and B, respectively.

In addition, the hydrophilic bank 251 may be further formed to expose center areas of the auxiliary electrodes 240 and to cover edge areas of the auxiliary electrodes 240. The exposed areas of the auxiliary electrodes 240 covered by the bank 250 may be defined as the transmissive areas TA.

The hydrophilic bank 251 is formed of hydrophilic inorganic insulating material, such as silicon oxide (SiO₂) and silicon nitride (SiNx), which allows a solution to be spread well when the light-emitting layer 220 that will be described later is formed.

The hydrophobic bank 252 may be formed on a part of the area on the hydrophilic bank 251. The hydrophobic bank 252 is formed on the hydrophilic bank 251 that extends in the row direction X. Therefore, the hydrophobic bank 242 is disposed between the pixel rows that are neighboring in the column direction Y, thereby dividing a space between the pixel rows. A space between the main light-emitting area EA and the auxiliary light-emitting area sEA that are neighboring in the row direction X may not be divided by the hydrophobic bank 252.

In addition, the hydrophobic bank 252 may be formed on the hydrophilic bank 251 that surrounds the edge of the auxiliary electrode 240. The transmissive area TA and the main peripheral light-emitting area EA and the auxiliary light-emitting area sEA may be divided from each other.

At least one area of the hydrophobic bank 252, for example, an upper area of the hydrophobic bank 252, is formed to have a hydrophobic property, thereby preventing a color-mixing issue from occurring between the pixel rows.

The light-emitting layer 220 is formed within an area surrounded by the bank 250. Specifically, the light-emitting layer 220 may be formed continuously along the pixel rows that are divided by the hydrophobic bank 252. The light-emitting layer 220 may be formed on the area other than the transmissive area TA divided by the bank 250, that is, the main light-emitting area EA and the auxiliary light emitting area sEA.

In the aspect, the light-emitting layer 220 may be formed by a solution process. For example, a solution for forming the light-emitting layer 220 may be applied within an area surrounded by the bank 250. The solution may be manufactured by mixing an organic material forming the light-emitting layer 220 with a solvent. The solution may be jetted on a light-emitting area by using inkjet equipment in which a nozzle is mounted on an inkjet head and the like. At this time, the solutions are mixed around the hydrophilic bank 251 and may be separated from each other around the hydrophobic bank 252.

The applied ink is hardened and forms the light-emitting layer 220. The ink contracts as the solvent evaporates during hardening, and may be separated from each other around the hydrophilic bank 251. The light-emitting layer 220 that will be formed by the solution process may have a lower surface of a center area than a surface of an edge area that is in contact with the bank 250, but the aspect is not limited thereto. After a hardening process, the light-emitting layer 220 is formed continuously instead of separated between the main light-emitting area EA and the auxiliary light-emitting area sEA that are disposed alternately along the row direction X.

In the aspect as described above, during the solution process, the light-emitting layer 220 is formed continuously between the main light-emitting area EA and the auxiliary light-emitting area sEA. Therefore, in a transparent display device, a surface flatness of the light-emitting layer 220 may be improved by performing the solution process, and a thickness difference of the light-emitting layer 220 and a resulting luminance deviation may be reduced.

When the driving current is not applied to the auxiliary anode electrode 212, the light-emitting layer 220 in the auxiliary light-emitting area sEA does not emit light. The light-emitting layer 220 substantially maintains a transparent state when the light-emitting layer 220 does not emit light, so that a transparency of the display panel 50 is not deteriorated.

The cathode electrode 230 is formed on the light-emitting layer 220. The cathode electrode 230 may be formed widely on the display panel 50. That is, at the main light-emitting area EA and the auxiliary light-emitting area sEA, the cathode electrode 230 may be in contact with the light-emitting layer 220. In addition, at the transmissive area TA, the cathode electrode 230 may be in contact with the auxiliary electrode 240. At the transmissive area TA, the cathode electrode 230 may be connected to the low-potential auxiliary wiring 123 via the auxiliary electrode 240 and the bridge electrode 183. That is, the transmissive area TA may form an auxiliary electrode contact portion where the cathode electrode 230 and the auxiliary electrode 240 are directly in contact with each other.

The cathode electrode 230 may be formed of a transparent conductive material (TCO) capable of transmitting light, or semi-transmissive conductive material. Since the cathode electrode 230 and the auxiliary electrode 240 are formed of the transparent conductive material, the cathode electrode 230 and the auxiliary electrode 240 are allowed to be directly in contact with each other without lowering transparency of the display panel 50 even if the auxiliary electrode contact portion is formed within the transmissive area TA.

Before the pixels are repaired, the display panel 50 displays an image through the main light-emitting elements LD that are disposed on the main light-emitting areas EA of the pixels R, G, and B. When a failure occurs in any of the pixels R, G, and B, a connection between the main light-emitting element LD of the corresponding pixel R, G, and B and the driving transistor DT may be cut, and the auxiliary light-emitting element sLD may be connected to the driving transistor DT. Then, the auxiliary light-emitting area sEA functions as the main light-emitting area EA, so that the image may be displayed through the auxiliary light-emitting element sLD.

Hereinafter, a method of repairing a pixel, as described above, will be described in detail.

Figure 8:
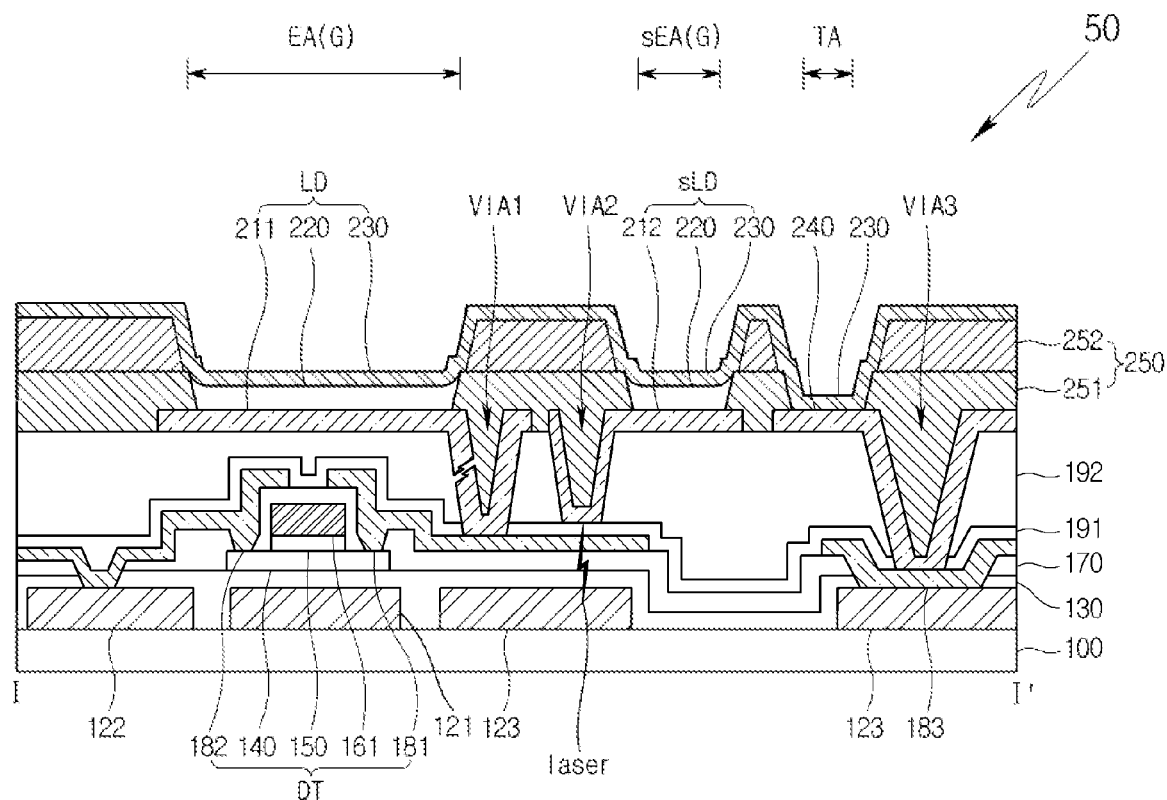
Figure 9:
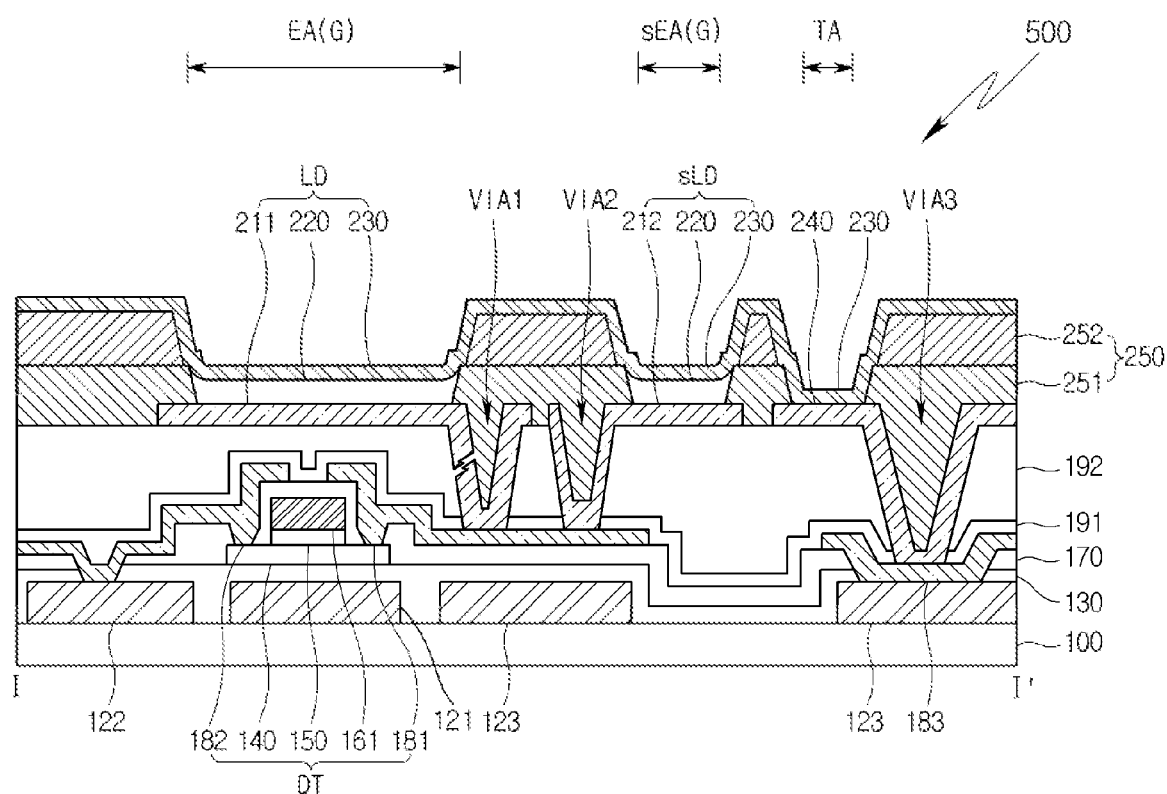
Figure 10:
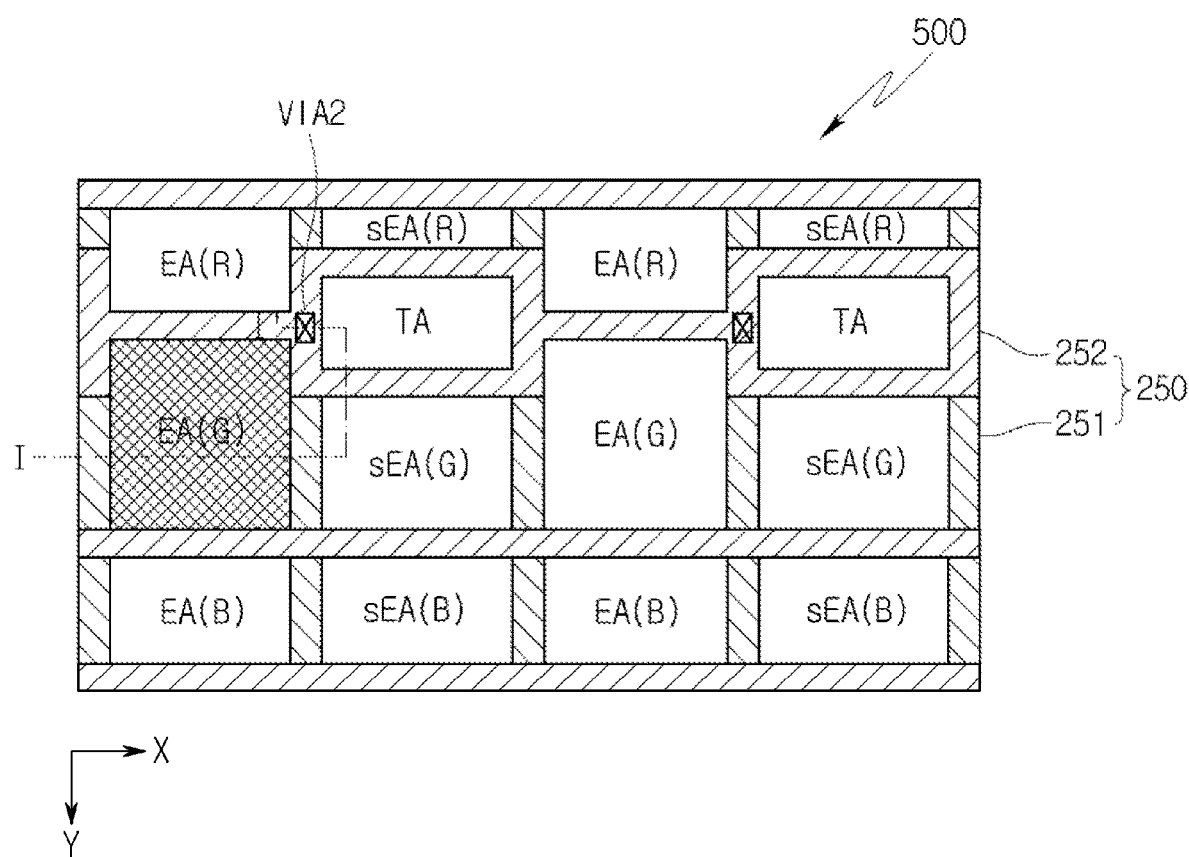
FIG. 10 is a plan view illustrating a repaired pixel according to an aspect of the present disclosure.

FIGS. 6 to 9 are views illustrating a process of repairing a pixel according to an aspect of the present disclosure. FIG. 10 is a plan view illustrating an aspect of a repaired pixel according to an aspect of the present disclosure.

In this aspect of the present disclosure, a pixel may not properly display an image when a failure occurs in the main light-emitting element LD of any pixel. For example, the red pixel R and the blue pixel B may properly emit light, but a failure may occur in the green pixel G. To resolve this, a pixel repairing may be performed.

Figure 6:
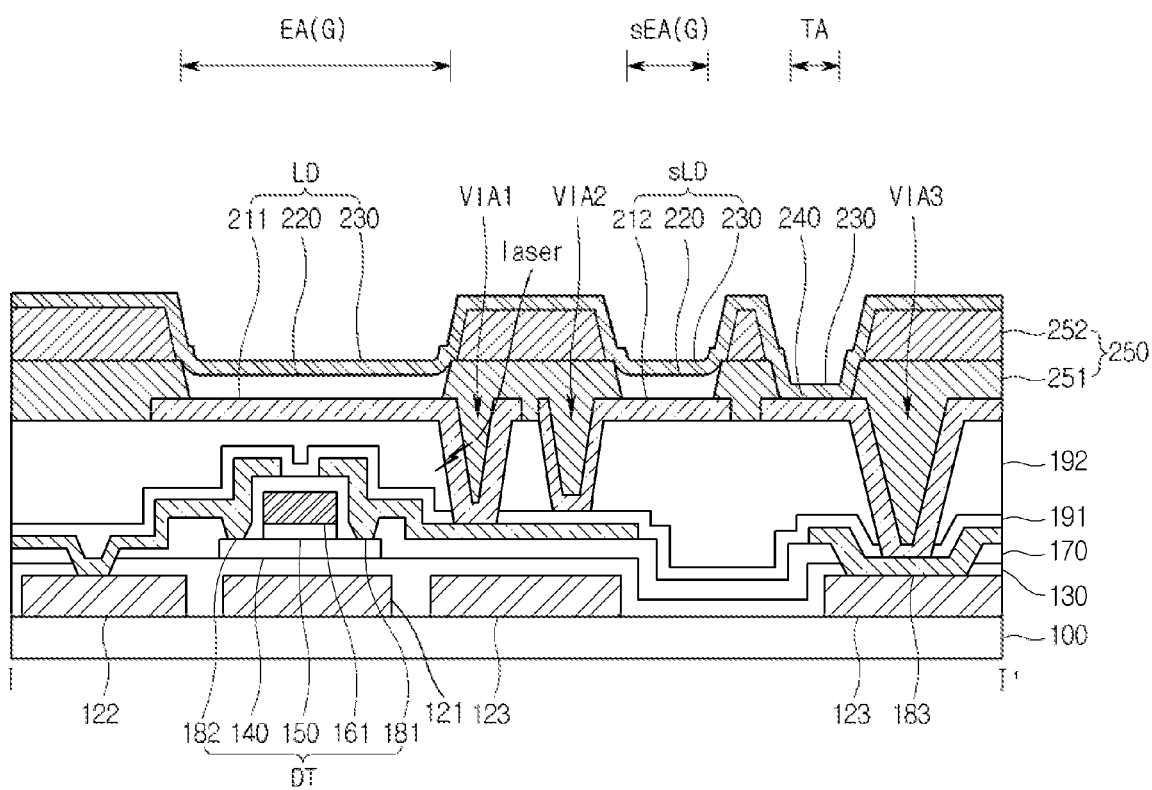
FIGS. 6 to 9 are cross-sectional views illustrating a method of repairing a pixel according to an aspect of the present disclosure.

A repairing process may be performed by a laser cutting and a laser welding. First, as illustrated in FIG. 6, laser may be radiated between the main anode electrode 211 and the driving transistor DT of a pixel in which a failure occurs. The laser may be selected with a wavelength capable of selectively transferring energy to the main anode electrode 211. At this time, in order to prevent damage to other circuit elements including the source electrode 181 of the driving transistor DT, the laser may be radiated from an upper portion of the display panel 50.

Figure 7:
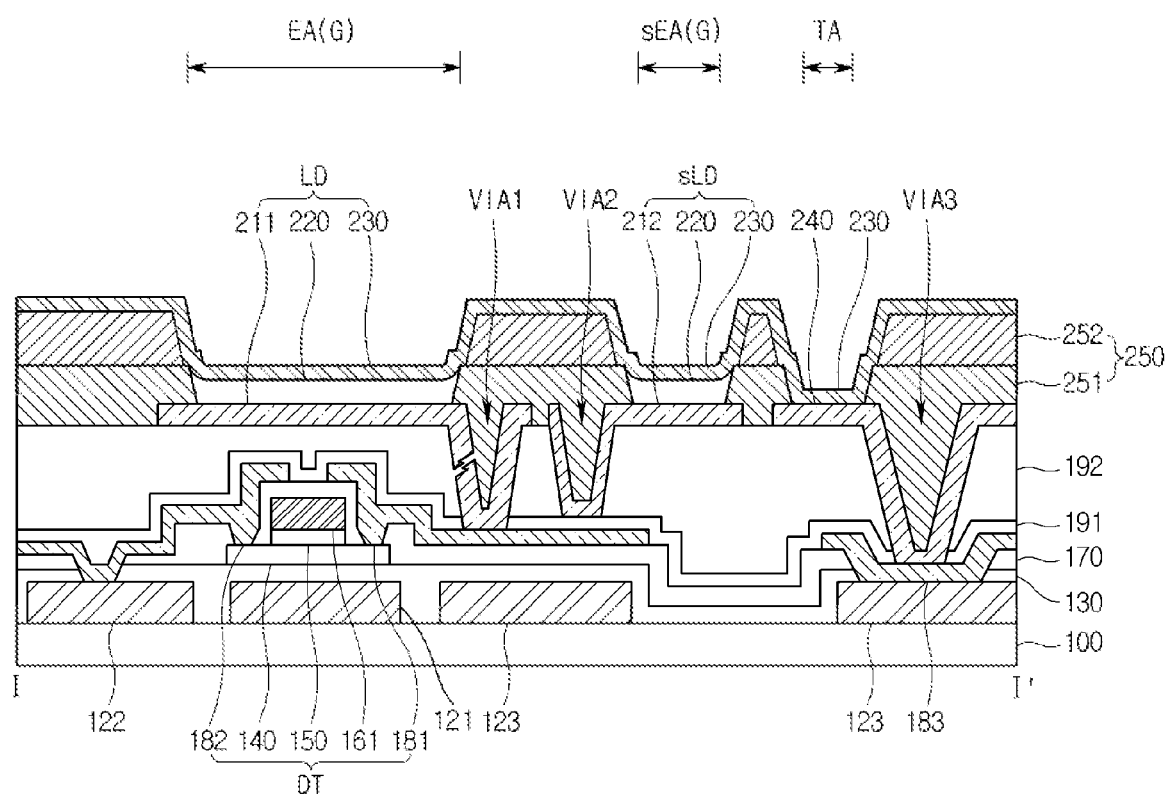

Then, the main anode electrode 211 may be cut by laser energy. As illustrated in FIG. 7, when the main anode electrode 211 is cut, an electrical connection between the driving transistor DT and the main anode electrode 211 may be cut off.

After then, as illustrated in FIG. 8, the laser may be radiated to the second via hole VIA2. The laser may be selected with a wavelength capable of selectively melting the passivation layer 191. Then, in the second via hole VIA2, the passivation layer 191 interposed between the auxiliary anode electrode 212 and the source electrode 181 may be removed, and the auxiliary anode electrode 212 and the source electrode 181 of the driving transistor DT may be in contact with each other as illustrated in FIG. 9. Then, the driving current controlled by the driving transistor DT may be applied to the auxiliary light-emitting element sLD, and the image may be displayed through the auxiliary light-emitting element sLD. Since the auxiliary anode electrode 212 and the cathode electrode 230 that form the auxiliary light-emitting element sLD is formed of the transparent conductive material and another conductive layer is not formed on the auxiliary light-emitting area sEA, the auxiliary light-emitting element sLD is driven in a dual-emission manner.

After the above-mentioned pixel repairing, as illustrated in FIG. 10, a main light-emitting area EA(G) of the green pixel G does not emit light since the electrical connection with the driving transistor DT is cut off, and an auxiliary light-emitting area sEA(G) of the green pixel G may perform a function of the main light-emitting area EA(G) instead. In this manner, a pixel failure can be resolved by repairing the pixel.

In the above-description, the method of repairing a pixel has been described by taking an example in which a failure occurs in the green pixel G. However, the present disclosure is not limited thereto, and the same repairing method may be applied to a situation when a failure occurs in other colors, that is, red or blue pixels R and B.

It will be understood by those skilled in the art that the present disclosure can be embodied in other specific forms without changing the technical idea or essential characteristics of the present disclosure. Therefore, it should be understood that the aspects described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A transparent display panel comprising:
a substrate where main light-emitting areas, auxiliary light-emitting areas, and transmissive areas are defined;
a driving transistor disposed on the substrate;
main anode electrodes disposed on the main light-emitting areas;
auxiliary anode electrodes disposed on the auxiliary light-emitting areas;
auxiliary electrodes disposed at the transmissive areas and connected to a first-potential driving power source; and
a bank defining the main light-emitting areas, the auxiliary light-emitting areas and the transmissive areas and adjoining edge areas of the main anode electrodes, the auxiliary anode electrodes and the auxiliary electrodes,
wherein the main light-emitting areas and the auxiliary light-emitting areas do not overlap each other.

2. The transparent display panel of claim 1, wherein each of the auxiliary anode electrodes and the auxiliary electrodes includes a transparent conductive material.

3. The transparent display panel of claim 2, wherein the main light-emitting areas having a same color are disposed in a row direction, and the main light-emitting areas having different colors are disposed in a column direction that is perpendicular to the row direction.

4. The transparent display panel of claim 3, wherein the auxiliary light-emitting areas are disposed between the main light-emitting areas having the same color adjacent to each other in the row direction, and the transmissive areas are disposed between the auxiliary light-emitting areas adjacent to each other in the column direction.

5. The transparent display panel of claim 4, wherein the bank comprises:

a hydrophilic bank surrounding the main light-emitting areas, the auxiliary light-emitting areas, and the transmissive areas; and a hydrophobic bank disposed on an area of the hydrophilic bank and dividing pixel rows by being extended in the row direction, and disposed to surround the transmissive areas such that the transmissive areas are divided from the adjacent main light-emitting areas and the adjacent auxiliary light-emitting areas.

6. The transparent display panel of claim 5, further comprising a light-emitting layer formed on each of the main anode electrodes and the auxiliary anode electrodes, wherein a surface of an edge area of the light-emitting layer adjacent to the bank is higher than a surface of a center area of the light-emitting layer.

7. The transparent display panel of claim 6, further comprising a cathode electrode formed on the substrate and formed of a transparent conductive material, wherein, in the transmissive area, the cathode electrode is in direct contact with the exposed center areas of the auxiliary electrodes.

8. The transparent display panel of claim 3, further comprising second-potential auxiliary wirings and first-potential auxiliary wirings extended in the column direction on the substrate and disposed alternately between the main light-emitting areas and the auxiliary light-emitting areas.

9. The transparent display panel of claim 8, wherein at least one area of each of the auxiliary electrodes overlaps with a corresponding first-potential auxiliary wiring, and the auxiliary electrode is connected to the first-potential auxiliary wiring through a via hole.

10. The transparent display panel of claim 9, wherein the via hole is covered by the hydrophobic bank that surrounds the transmissive areas.

11. The transparent display panel of claim 3, wherein the driving transistor disposed on the substrate is configured to supply a driving current to the main anode electrodes or the auxiliary anode electrodes.

12. The transparent display panel of claim 11, wherein the driving transistor comprises:

a source electrode connected to a corresponding main anode electrode or a corresponding auxiliary anode electrode;

a drain electrode connected to a second-potential auxiliary wiring; and a gate electrode receiving a data signal.

13. The transparent display panel of claim 12, wherein, with respect to at least a portion of the driving transistor, a space between the source electrode and the corresponding main anode electrode is cut by laser, and the space between the source electrode and the corresponding main anode electrode is welded by laser.

14. A transparent display panel comprising:

a hydrophilic bank surrounding main light-emitting areas, auxiliary light-emitting areas, and transmissive areas;

a hydrophobic bank disposed on an upper portion of the hydrophilic bank and dividing pixel rows in a row direction and surrounding the transmissive areas;

main anode electrodes disposed on the main light-emitting areas;

auxiliary anode electrodes disposed on the auxiliary light-emitting areas;

auxiliary electrodes disposed at the transmissive areas and connected to a first-potential driving power source; and a light-emitting layer disposed on the main anode electrodes and the auxiliary anode electrodes, wherein edge areas of the light-emitting layer adjacent to the hydrophilic bank are thicker than a center area of the light-emitting layer, and wherein the main light-emitting areas and the auxiliary light-emitting areas do not overlap each other.

15. The transparent display panel of claim 14, wherein each of the auxiliary anode electrodes and the auxiliary electrodes includes a transparent conductive material.

16. The transparent display panel of claim 14, wherein the main light-emitting areas having a same color are disposed in the row direction, and the main light-emitting areas having different colors are disposed in a column direction that is perpendicular to the row direction.

17. The transparent display panel of claim 14, wherein the auxiliary light-emitting areas are disposed between the main light-emitting areas having the same color adjacent to each other in the row direction, and the transmissive areas are disposed between the auxiliary light-emitting areas adjacent to each other in the column direction.

18. The transparent display panel of claim 14, further comprising second-potential auxiliary wirings and first-potential auxiliary wirings extended in the column direction and disposed alternately between the main light-emitting areas and the auxiliary light-emitting areas.

19. The transparent display panel of claim 18, wherein at least one area of each of the auxiliary electrodes overlaps with a corresponding first-potential auxiliary wiring, and the auxiliary electrode is connected to the first-potential auxiliary wiring through a via hole.

20. The transparent display panel of claim 19, wherein the via hole is covered by the hydrophobic bank that surrounds the transmissive areas.

* * * * *